United States Patent
Lahti et al.

(10) Patent No.: US 9,291,116 B2
(45) Date of Patent: Mar. 22, 2016

(54) ENGINE OPERATION WITH AIR SYSTEM MODEL

(71) Applicant: Deere & Company, Moline, IL (US)

(72) Inventors: John L. Lahti, Cedar Falls, IA (US); Michael J. Pipho, Dunkerton, IA (US)

(73) Assignee: Deere & Company, Moline, IL (US)

( * ) Notice: Subject to any disclaimer, the term of this patent is extended or adjusted under 35 U.S.C. 154(b) by 301 days.

(21) Appl. No.: 13/962,726

(22) Filed: Aug. 8, 2013

(65) Prior Publication Data

US 2015/0046064 A1 Feb. 12, 2015

(51) Int. Cl.
| | |
|---|---|
| *F02D 41/08* | (2006.01) |
| *F02D 41/00* | (2006.01) |
| *F02D 41/18* | (2006.01) |
| *G06F 17/50* | (2006.01) |
| *F02D 41/14* | (2006.01) |
| *F02B 37/013* | (2006.01) |
| *F02M 25/07* | (2006.01) |
| *F02B 37/12* | (2006.01) |
| *F02B 29/04* | (2006.01) |
| *F02B 37/24* | (2006.01) |

(52) U.S. Cl.
CPC .............. *F02D 41/18* (2013.01); *F02B 37/013* (2013.01); *F02D 41/0072* (2013.01); *F02D 41/1447* (2013.01); *F02M 25/0704* (2013.01); *G06F 17/50* (2013.01); *F02B 29/0406* (2013.01); *F02B 37/24* (2013.01); *F02B 2037/122* (2013.01); *F02D 41/0007* (2013.01); *F02D 41/1448* (2013.01); *F02D 2041/1433* (2013.01); *F02D 2200/0402* (2013.01); *F02D 2200/0406* (2013.01); *F02D 2200/0416* (2013.01); *F02M 25/0727* (2013.01); *F02M 25/0738* (2013.01)

(58) Field of Classification Search
CPC . F02D 41/0002; F02D 41/263; F02D 41/145; F02D 41/18

USPC .............. 701/103, 102, 101, 108; 73/114.74; 703/7
See application file for complete search history.

(56) References Cited

U.S. PATENT DOCUMENTS

| | | | |
|---|---|---|---|
| 6,115,664 A * | 9/2000 | Cullen et al. ................... | 701/102 |
| 6,928,360 B2 * | 8/2005 | Baeuerle et al. .............. | 701/102 |
| 7,117,078 B1 | 10/2006 | Gangopadhyay | |
| 2003/0093212 A1 * | 5/2003 | Kotwicki et al. ............. | 701/102 |
| 2006/0011178 A1 * | 1/2006 | Wild et al. ............... | 123/568.16 |
| 2008/0040085 A1 * | 2/2008 | Wang ................................ | 703/7 |
| 2011/0172896 A1 * | 7/2011 | Oie et al. ....................... | 701/103 |
| 2013/0158834 A1 * | 6/2013 | Wagner et al. ................ | 701/102 |

FOREIGN PATENT DOCUMENTS

| | | | |
|---|---|---|---|
| WO | 9735106 | A2 | 9/1997 |
| WO | 03046356 | A2 | 6/2003 |

OTHER PUBLICATIONS

European Patent Office, Extended European Search Report in Application No. 14177205.3 dated Jul. 29, 2015.

* cited by examiner

*Primary Examiner* — Mahmoud Gimie
(74) *Attorney, Agent, or Firm* — Ingrassia, Fisher & Lorenz PC

(57) ABSTRACT

A system is described for modeling various states of an operating engine and the adjustment of one or more operating characteristics of the engine based upon such modeling. A representative rate of change of a system mass for an engine is determined based upon, at least in part, a first state equation. A first representative mass flow approximating a mass flow across a throttle is determined based upon, at least in part, a second state equation. A second representative mass flow approximating a mass flow across an exhaust gas recirculation valve is determined based upon, at least in part, a third state equation. Determining the first representative mass flow includes specifying a throttle time constant modifier for the second state equation. Determining the second representative mass flow includes specifying an exhaust gas recirculation valve time constant modifier for the third state equation.

20 Claims, 7 Drawing Sheets

ENGINE OPERATION WITH AIR SYSTEM MODEL

CROSS-REFERENCE TO RELATED APPLICATION(S)

Not applicable.

STATEMENT OF FEDERALLY SPONSORED RESEARCH OR DEVELOPMENT

Not applicable.

FIELD OF THE DISCLOSURE

This disclosure relates to engine operation, and in particular to the modeling of various engine states and processes during engine operation.

BACKGROUND OF THE DISCLOSURE

It may be useful in various situations to model the operation of engines (e.g., gasoline or diesel engines) in order to appropriately identify, understand and/or respond to various engine states. For example, it may be useful to model pressures, temperatures, mass flow rates, and various other parameters, with respect to various points or volumes within an engine in order to inform the adjustment of operating characteristics of the engine and thereby improve power delivery, fuel efficiency, engine life, and so on. Similar information regarding engine operation may similarly be gleaned, in certain settings, from appropriate instrumentation of the engine (e.g., by providing the engine with various pressure, temperature, mass flow, and/or other sensors). Such instrumentation can be expensive, however, particularly with respect to mass-produced consumer or industrial vehicles. Instrumentation is also sometimes prone to malfunction or other failure, which may lead to imperfect identification or understanding of current engine operating states and/or require time-consuming and expensive repairs.

Various models are known that may be utilized to represent the operating states of various engine locations and/or components or groups of components. For example, physics based models and regression models may be utilized to predict residual mass and volumetric efficiency of an engine cylinder, compressor and turbine maps may be utilized to predict characteristics of compressor and turbine operation, the compressible gas flow equation may be utilized to predict characteristics of throttle or valve flow, and so on. Many of these models are highly non-linear and their implementation may accordingly be complex and/or computationally intensive.

One type of engine model, an air system model, utilizes a mean value model to represent engine cylinders. Under this type of model, flow through an engine may be assumed to be continuous, as opposed to exhibiting discrete cylinder events. As such, using intake mixture density (e.g., from intake air and recirculated exhaust gas), engine speed, engine displacement, and a volumetric efficiency correction, the flow of mass through the engine may be calculated.

Prior manifestations of air system models, however, tend to exhibit numerical instability in certain situations. For example, when resistance to mass flow is very low (e.g., when relevant throttles and/or valves are fully or nearly fully open), small changes in pressure can result in large changes in mass flow. In turn, such changes in mass flow may significantly affect the modeled pressure, resulting in unstable oscillations in the predicted pressures that may not accurately reflect actual engine operating conditions. Past efforts to address this issue have included introducing additional resistance to the mass flow in certain circumstances (e.g., at pressure ratios close to 1) and using a very small time step (e.g., less than 1 ms) for the model. Such efforts, however, may tend both to contribute to steady state model errors and to require an excessive number of calculations for a given time interval. The latter issue, in particular, may prevent use of such models with respect to real-time operation of an engine because the high demand for calculations tends to consume significant portions, including potentially all, of the processor capacity of the available computer resources (e.g., the engine control unit associated with a particular engine).

A method and system for modeling engine operation as an air system while addressing these and other issues is accordingly needed.

SUMMARY OF THE DISCLOSURE

A system and method are disclosed for the modeling of various aspects of engine operation and for the real-time operation and adjustment of an engine in conjunction with such modeling.

According to one aspect of the disclosure, a computer-implemented method may include determining, by one or more computing devices, a representative rate of change of a system mass for an engine based upon, at least in part, a first state equation. A first representative mass flow may be determined for the engine based upon, at least in part, a second state equation, the first representative mass flow approximating a mass flow across a throttle corresponding to a pressure drop across the throttle. A second representative mass flow for the engine may be determined based upon, at least in part, a third state equation, the second representative mass flow approximating a mass flow across an exhaust gas recirculation valve corresponding to a pressure drop across the exhaust gas recirculation valve. Determining the first representative mass flow may include specifying a throttle time constant modifier for the second state equation. Determining the second representative mass flow may include specifying an exhaust gas recirculation valve time constant modifier for the third state equation.

According to another aspect of the disclosure, a vehicle may include an engine in an operating state, the engine including an air throttle located between a charge air cooler and an intake manifold, and an exhaust gas recirculation valve located between an exhaust gas recirculation cooler and an intake manifold. The system may further include an engine control unit associated with the engine, the engine control unit including one or more processor devices and one or more memory architectures coupled with the one or more processor devices. The one or more processor devices may be configured to determine a representative rate of change of a system mass for an engine based upon, at least in part, a first state equation. The one or more processor devices may be further configured to determine a first representative mass flow for the engine based upon, at least in part, a second state equation, wherein the first representative mass flow approximates a mass flow across the air throttle corresponding to a pressure drop across the throttle. The one or more processor devices may be further configured to determine a second representative mass flow for the engine based upon, at least in part, a third state equation, wherein the second representative mass flow approximates a mass flow across the exhaust gas recirculation valve corresponding to a pressure drop across the exhaust gas recirculation valve. Determining the first and/or second representative mass flow may include specifying an air throttle time constant modifier for the second state equation and/or an exhaust gas recirculation valve time constant modifier for the third state equation.

One or more of the following features may also be included. The time constant modifiers may be determined based upon an operating characteristic of the engine control unit or another relevant computing device. Various input values for the state equations may be received from instrumentation associated with the engine and/or other models associated with operation of the engine. The first state equation may include a mass flow balance. The second state equation may include a throttle capacitance, a charge air cooler capacitance, and an intake manifold capacitance. The third state equation may include an exhaust gas recirculation capacitance, an exhaust manifold capacitance, and an intake manifold capacitance. One or more operating pressures for the engine may be determined based upon the determined rate of change of the system mass, and/or the first and/or second representative mass flows. One or more operating characteristics of the engine may be adjusted based upon determining the rate of change of the system mass, the first and/or second representative mass flows, and/or the various operating pressures.

The details of one or more implementations are set forth in the accompanying drawings and the description below. Other features, implementations, and advantages will become apparent from the description, the drawings, and the claims.

BRIEF DESCRIPTION OF THE DRAWINGS

Like reference symbols in the various drawings indicate like elements.

DETAILED DESCRIPTION

The following describes one or more example embodiments of the disclosed system and method, as shown in the accompanying figures of the drawings described briefly above. Various modification(s) to the example embodiments may be contemplated by one of skill in the art. For example, aspects of the disclosure may be additionally or alternatively implemented as a computer program product residing on a computer readable storage medium on which a plurality of instructions are stored. When executed by a processor, these instructions may cause a processor to perform various operations consistent with the disclosure herein.

Figure 1:
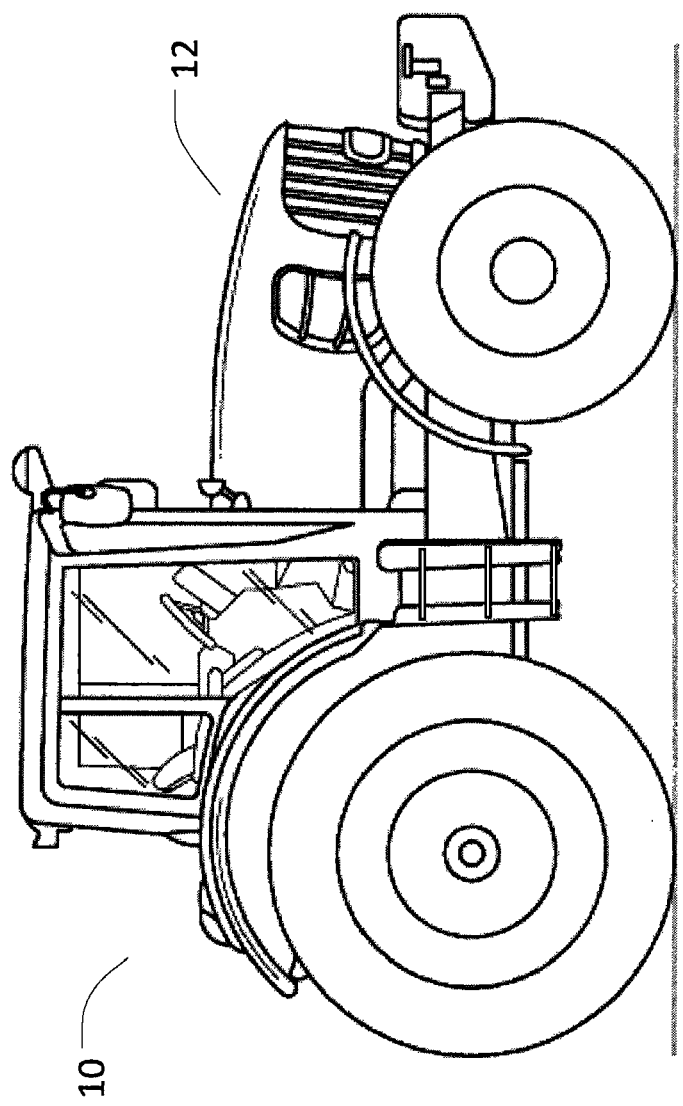
FIG. 1 is a side view of an example vehicle with respect to which the disclosed system and/or method may be implemented.

The disclosed system 10 and method 100 may be used advantageously in a variety of settings and with a variety of engine in work and/or vehicle types, including engines in work vehicles for agricultural, construction, forestry, and various other applications. Referring now to FIG. 1, for example, work vehicle 10 is depicted as a typical agricultural tractor having diesel engine 12. However, the principles disclosed herein could be incorporated into and utilized with powered pedestrian and work vehicles having a variety of combustion-based power plants. As such, the term "vehicle" is not to be interpreted as limited to the specific vehicle 10 depicted, nor is the term "engine" to be interpreted as limited to a particular combustion engine (e.g., engine 12) or engine type. Further, it will be understood that the system 10 and method 100 may be implemented through configuration of a vehicle during manufacture and through retrofit of a pre-existing vehicle.

Figure 2:
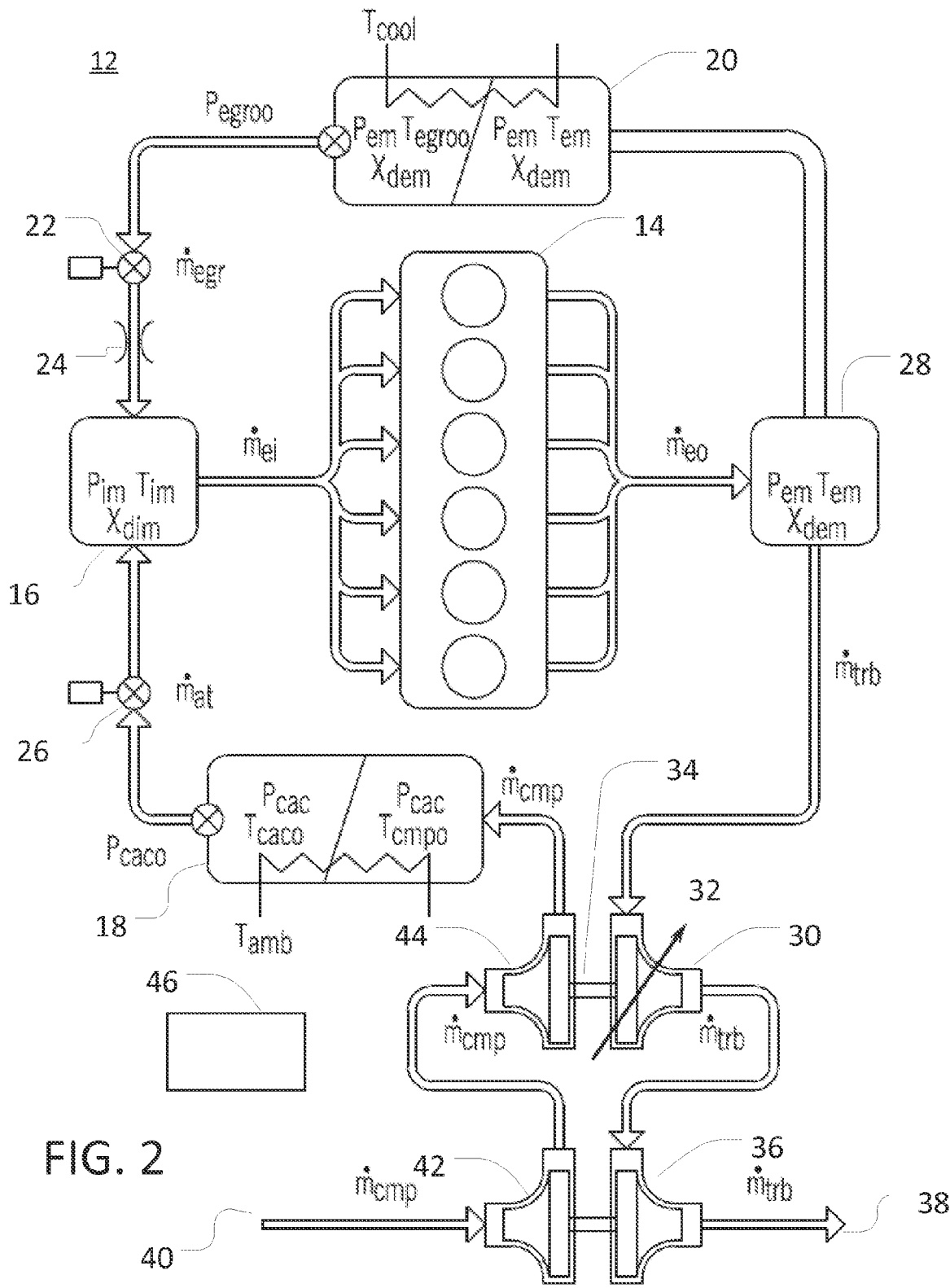
FIG. 2 is a diagrammatic view of an engine associated with the example vehicle of FIG. 1.

Referring now also to FIG. 2, engine 12 may have various known configurations. As depicted, for example, engine 12 may include cylinder block 14, including various combustion cylinders. Cylinder block 14 may receive a mass flow ($\dot{m}_{ei}$) via intake manifold 16, which may exhibit characteristics including a particular pressure ($P_{im}$), temperature ($T_{im}$), and mixture mole fraction ($X_{dim}$). In certain embodiments, $\dot{m}_{ei}$ may include a mix of intake air and recirculated exhaust gas. In certain embodiments, intake manifold 16 (and/or various other components or volumes of engine 12) may be configured to include (and/or communicate with) one or more temperature sensors (not shown), pressure sensors (not shown), and other instrumentation (not shown), which may generally be configured to communicate with each other and other electronic devices (e.g., engine control unit (ECU) 46).

In certain embodiments, $\dot{m}_{ei}$ may result, at least in part, from mass flow into intake manifold 16 from both charge air cooler (CAC) 18 and exhaust gas recirculation (EGR) cooler 20. CAC 18 may exhibit characteristics including a particular inlet pressure ($P_{cac}$), inlet temperature (depicted here as equivalent to an outlet temperature ($T_{cmpo}$) of compressor 44, as will be discussed in greater detail below), outlet temperature ($T_{caco}$), and outlet pressure ($P_{caco}$). EGR cooler 20 may exhibit characteristics including a particular pressure (depicted here as equivalent to the pressure ($P_{em}$) at exhaust manifold 28, as will be discussed in greater detail below), inlet temperature (depicted here as equivalent to the temperature ($T_{em}$) at exhaust manifold 28, as will be discussed in greater detail below), outlet temperature ($T_{egrco}$), mole fraction (depicted here as equivalent to the mole fraction ($X_{dem}$) at exhaust manifold 28, as will be discussed in greater detail below), and outlet pressure ($P_{egrco}$).

It will be understood that certain parameters, as depicted in FIG. 2, may represent simplifying assumptions regarding the flow of mass through (and various other operational aspects of) various elements of engine 12. For example, it will be understood that the actual pressure and temperature at EGR cooler 20 may not be exactly equivalent to the pressure and temperature at exhaust manifold 28. Similarly, pressure may not remain constant across CAC 18 or EGR cooler 20, as depicted. Nonetheless, these assumptions (and various others) may advantageously permit effective and efficient modeling of aspects of engine 12, as will be further elaborated in the following discussion.

Due to a difference between $P_{egrco}$ and $P_{im}$, mass may flow at a rate of $\dot{m}_{egr}$ across EGR valve 22 and through EGR flow venturi 24. It will be understood that EGR valve 22 may be configured in a variety of known ways and may be adjustable in order to regulate associated pressures and mass flows. In certain embodiments, for example, ECU 46 may communicate via electronic means (not shown) with a controller such as a solenoid or other actuator (not shown) capable of adjusting the flow opening or other characteristics of EGR valve 22.

Similarly, due to a difference between $P_{caco}$ and $P_{im}$, mass may flow at a rate of $\dot{m}_{at}$ across air throttle 26. It will be understood that air throttle 26 may be configured in a variety of known ways and may be adjustable in order to regulate associated pressures and mass flows. In certain embodiments, for example, ECU 46 may communicate via electronic means (not shown) with a controller such as a solenoid or other actuator (not shown) capable of adjusting the flow opening or other characteristics of air throttle 26.

During operation of engine 12, combustion products and other material (e.g., unburned fuel) may flow ($\dot{m}_{eo}$) out of cylinder block 14 to exhaust manifold 28. Exhaust manifold 28 may exhibit characteristics including, as also noted above, a particular mole fraction ($X_{dem}$), pressure ($P_{em}$), and temperature ($T_{em}$). The mass flow out of the cylinder block (i.e., $\dot{m}_{eo}$) may be divided by exhaust manifold 28 (e.g., based in part on the results of adjustments to EGR valve 22 and/or other mechanisms) into a first mass flow into EGR cooler 20 (corresponding, at steady state, to $\dot{m}_{egr}$) and a second mass flow ($\dot{m}_{trb}$) to a turbocharger.

As is known, a turbocharger may include high pressure turbine 30. In certain embodiments, a turbocharger may be a variable geometry turbocharger, with high pressure turbine 30 having an associated (adjustable) vane position 32. In certain embodiments, a turbocharger may include turbocharger speed sensor 34, which may, for example, determine the rotational speed of high pressure turbine 30 in various known ways. A turbocharger may further include, for example, lower pressure turbine 36, which may be connected to exhaust outlet 38.

Engine 12 may further include air intake 40, which may admit air from the ambient environment (or another source) to low pressure compressor 42, followed by high pressure compressor 44. In certain embodiments, sensors at air intake 40 (not shown) may measure inlet temperature, inlet pressure and/or various other quantities.

As also noted above, engine 12 may include ECU 46, which may be a computing device of various known configurations. In certain embodiments, ECU 46 may receive information from various sensors distributed throughout engine 12 and/or vehicle 10, and may be in communication via known electronic means (not shown) with various engine components and/or other computing devices (not shown) or electronic instruments (not shown).

Figure 3:
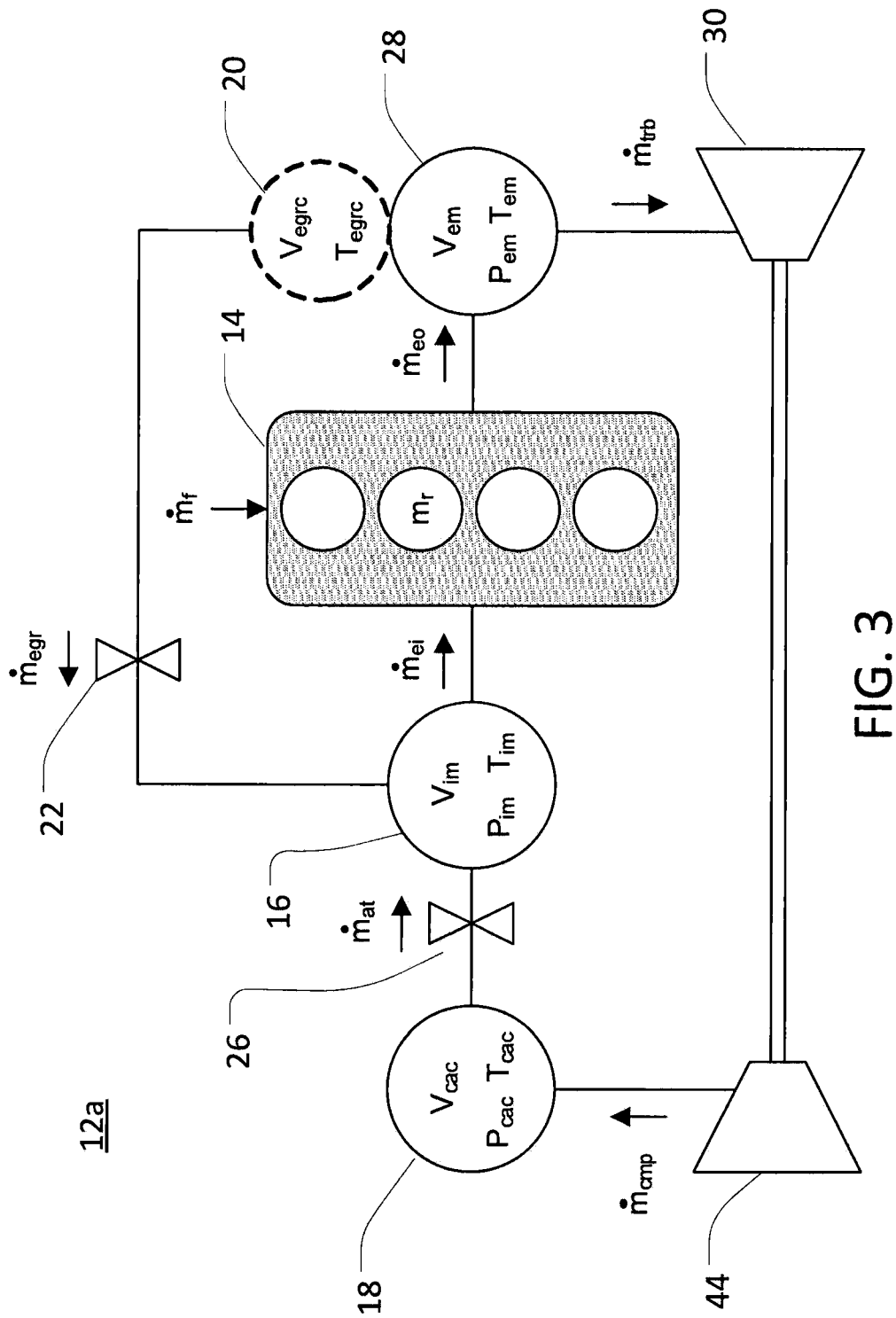
FIG. 3 is simplified view of an engine associated with the example vehicle of FIG. 1.

Referring now also to FIG. 3, it may be useful, for the purpose of real-time modeling and adjustment of engine operation, to implement certain simplifying assumptions with respect to the disclosed air system model. For example, as depicted in simplified engine schematic 12a, it may be useful to assume for that there is no interstage mass storage in the turbocharger, that there is no mass storage between air throttle 26 and the outlet restriction in CAC 18, that there is no mass storage between EGR valve 22 and the outlet restriction in EGR cooler 20, and that EGR cooler 20 and exhaust manifold 28 represent essentially the same volume with uniform pressure and mixture composition. These assumptions may appropriately be made in various circumstances even though, for example, there may be some actual mass storage in the referenced locations and exhaust manifold 28 and EGR cooler 20 may actually define distinct and separate volumes (i.e., $V_{em}$ and $V_{egrc}$, respectively). Other useful assumptions may also be made, including, for example, that there is no temperature change across air throttle 26, EGR valve 22, or the outlet restrictions of CAC 18 and EGR cooler 20. Similarly (and as also depicted in FIG. 2), it may be a useful assumption to generally treat CAC 18, intake manifold 16, exhaust manifold 28, and EGR cooler 20 using lumped parameter (zero dimensional) models. In certain embodiments a slight exception to this assumption may be made by assuming that half of EGR cooler 20 and CAC 18 are at the outlet temperature, respectively, of those components (i.e., $T_{egrco}$ and $T_{caco}$), with the other halves, respectively, being at inlet temperatures (i.e., $T_{em}$ and $T_{cmpo}$), and with the volumes as a whole exhibiting average temperatures $T_{egrc}$ and $T_{cac}$ (e.g., as indicated in FIG. 3).

It will be understood that "real-time" as used herein may not denote absolutely synchronous operations, but rather operations which are separated by small enough units of time that their execution may be viewed as effectively simultaneous. For example, ECU 46 may be viewed as responding to a sensed (or modeled) pressure fluctuation with an appropriate adjustment to an engine valve in "real-time" so long as the ECU signal prompting the adjustment is provided before the sensed pressure fluctuation has significantly dissipated or otherwise significantly and materially changed so as to render the adjustment untimely.

As also noted above, in previous instances modeling certain aspects of the operation of engine 12, using mass and temperature to define the states of the volumes representing CAC 18, intake manifold 16, and exhaust manifold 28 ($V_{cac}$, $V_{im}$, and $V_{em}$, respectively), may result in numerical instability when either air throttle 26 or EGR valve 22 is fully (or nearly fully) open and the associated resistance to flow is accordingly very low. This is because when the valves are in such a state, a very small change in pressure across the valve may significantly affect the flow rate through the valve. For certain models, this may then result in the incorrect calculation of a similarly significant change in pressure across the valve. As such, model instability and corresponding undesirable oscillations in predicted pressures (and/or other modeled quantities) may have resulted.

Figure 4:
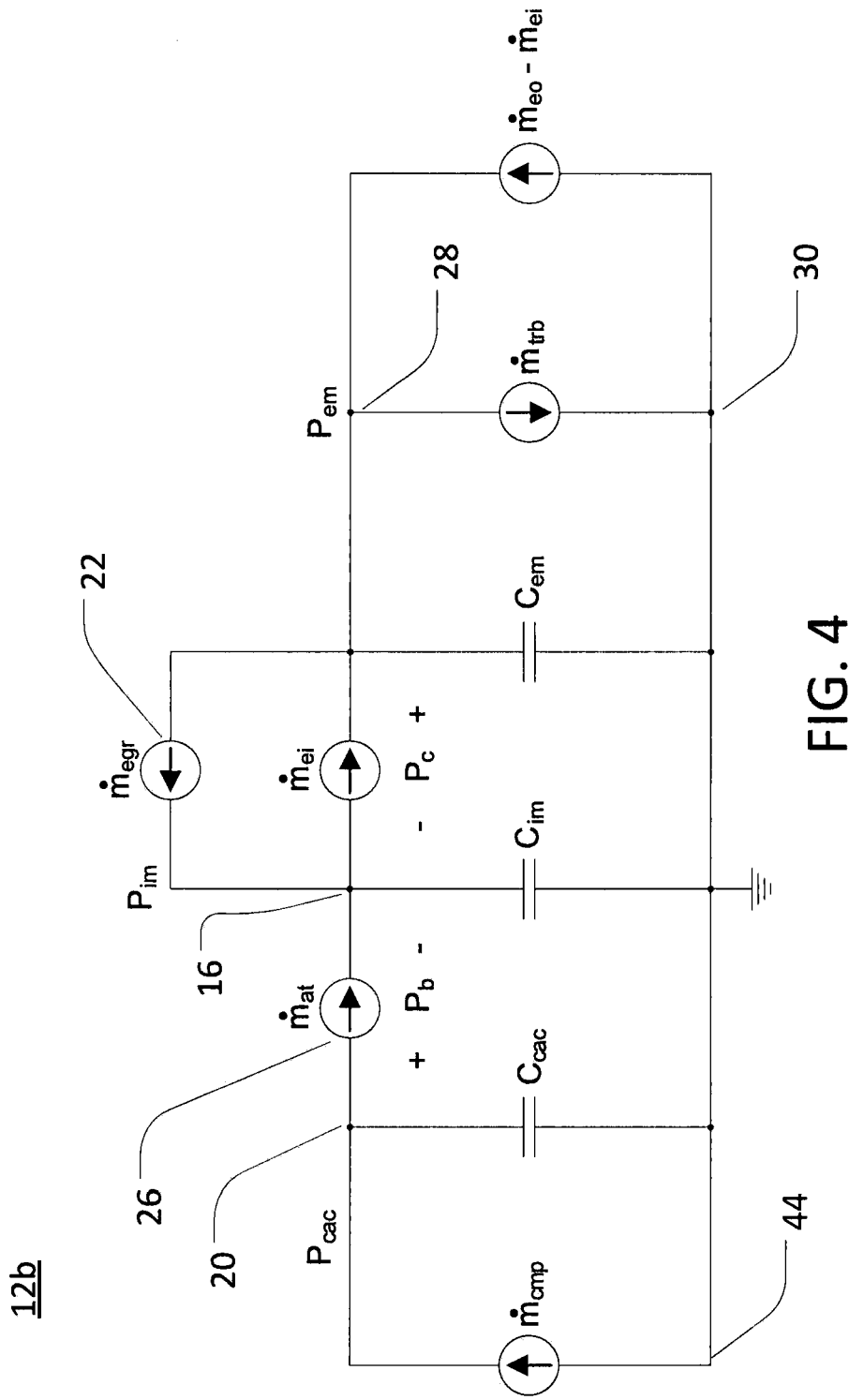
FIG. 4 is a schematic view of a modeling approach associated with the engine of FIG. 2 or FIG. 3.

It may be useful, therefore, to model certain aspects of operation of engine 12 using an air system model as described herein. Referring now also to FIG. 4, one aspect of such a model may be represented by circuit model 12b of engine 12 (and simplified engine schematic 12a), under known principles of system modeling. In circuit model 12b, relevant system volumes may be modeled as "capacitances" corresponding to those volumes, (e.g., $C_{cac}$ corresponding to $V_{cac}$, $C_{im}$ corresponding to $V_{im}$, and $C_{em}$ corresponding to $V_{em}$). Further, each circled arrow in FIG. 4 (as well as FIGS. 5 and 6) may represent a relevant mass flow rate, modeled as "current." Reference numerals have been provided with respect to FIG. 4 (as well as FIGS. 5 and 6) in order to orient the reader with respect to the engine elements (as depicted, for example, in FIG. 3) that correspond to various locations in circuit model 12b. It will be understood, however, that circuit model 12b will be addressed as a model circuit exhibiting characteristics that are equivalent in relevant ways to certain aspects of engine 12, rather than a physically exact representation of engine 12.

The right-most flow-rate in FIG. 4, $\dot{m}_{eo} - \dot{m}_{ei}$ represents the difference between the flow rate into cylinder block 14 and the flow rate out of cylinder block 14. This difference will be equal to the fuel mass flow injected into cylinders ($\dot{m}_f$) minus the rate of change of mass stored as residual within the engine ($\dot{m}_r$):

$$\dot{m}_{eo} - \dot{m}_{ei} = \dot{m}_f - \dot{m}_r. \tag{1}$$

As also noted above, the various capacitors depicted in circuit model 12b correspond to various volumes in engine schematic 12a. In general, under known principles, the capacitance of each such capacitor (C) may be defined as equal to the associated volume (V), divided by both the relevant specific gas constant (R) and a relevant associated temperature (T):

$$C = \frac{V}{R \cdot T}. \qquad (2)$$

A specific molar composition relevant to a particular capacitor or volume may be assumed, calculated in various ways, determined based upon measurements taken from relevant mass flows, or a combination thereof. (It will be noted, however, that for real-time operation of the discussed model, measurement of mass flow composition may not always be practical.) Similarly, a relevant temperature may be calculated in various ways (including based upon other state observer models), assumed, determined based upon measurements taken during operation of engine 12, or a combination thereof.

Under equation 2, relevant masses contained in particular modeled volumes may be calculated based on the ideal gas law or, equivalently, by multiplying the relevant capacitance by the relevant pressure:

$$m = \frac{P \cdot V}{R \cdot T} = C \cdot P. \qquad (3)$$

As such, the state equation for the rate of change of pressure ($\dot{P}_{im}$) of intake manifold 16 may be expressed as:

$$\dot{P}_{im} = \frac{1}{C_{im}} \cdot (\dot{m}_{at} + \dot{m}_{egr} - \dot{m}_{ei}), \qquad (4)$$

and an approximation of intake manifold pressure ($P_{im}$), may be determined by integrating the right side of equation 4. (It will be understood that the use of "approximation" herein refers simply to the physical reality that a model, particularly of a dynamic and complex system like an operating engine, necessarily calculates approximations of various conditions and values, rather than an exact value of such conditions or values. This is not intended to indicate that any such "approximation" is not a useful quantity or that an "approximation" may deviate from an actual value by a particular error rate. Rather, in many instances, a model-generated (or other) approximation and a corresponding actual, physical value may be functionally indistinguishable.)

Similarly, the state equation for pressure rate of CAC 20 ($\dot{P}_{cac}$) and pressure rate of exhaust manifold 28 ($\dot{P}_{em}$) may be expressed, respectively, as:

$$\dot{P}_{cac} = \frac{1}{C_{cac}} \cdot (\dot{m}_{cmp} - \dot{m}_{at}), \qquad (5)$$

and $$\dot{P}_{em} = \frac{1}{C_{em}} \cdot (\dot{m}_{eo} - \dot{m}_{egr} - \dot{m}_{trb}). \qquad (6)$$

As with $P_{im}$, the CAC pressure ($P_{cac}$) and exhaust manifold pressure ($P_{em}$) may be determined by integrating, respectively, the right sides of equations 5 and 6.

Equations 4 through 6 may become numerically unstable when either air throttle 26 or EGR valve 22 approach a fully open state, based upon, for example, the interaction between the selected model time steps and the tendency of the relevant modeled mass flow to exhibit significant fluctuation in response to small pressure changes when these valves are fully (or nearly full) open. In order to overcome this deficiency, it may be desirable to define new state equations that are more stable, and which may allow modification of model dynamics in appropriate ways without excessive detrimental impact on model accuracy.

Accordingly, a first new state may be defined as $P_a$, which represents a reference pressure equal to the total mass included in the three relevant volumes (i.e., $V_{cac}$, $V_{im}$, and $V_{em}$) divided by the total capacitance of those volumes:

$$P_a = \frac{m_{im} + m_{cac} + m_{em}}{C_{im} + C_{cac} + C_{em}} \qquad (7)$$

This new state, $P_a$, is not affected by flow through air throttle 26 or EGR valve 22, as such flow occurs between the three relevant volumes and therefore does not change the total mass referenced by equation 7. Alternatively, $P_a$ may be represented with respect to the original three pressure states, via substitution into equation 7 of appropriate implementations of equation 3:

$$P_a = \frac{C_{im} \cdot P_{im} + C_{cac} \cdot P_{cac} + C_{em} \cdot P_{em}}{C_{im} + C_{cac} + C_{em}}. \qquad (8)$$

Equation 8 may be usefully simplified by defining new parameters representing the fraction of total modeled capacitance contributed by any individual capacitance:

$$X_{im} = \frac{C_{im}}{C_{cac} + C_{im} + C_{em}}, \qquad (9)$$

$$X_{cac} = \frac{C_{cac}}{C_{cac} + C_{im} + C_{em}}, \qquad (10)$$

and $$X_{em} = \frac{C_{em}}{C_{cac} + C_{im} + C_{em}}. \qquad (11)$$

Substituting equations 9 through 11 into equation 8 accordingly yields, for state $P_a$:

$$P_a = X_{im} \cdot P_{im} + X_{cac} \cdot P_{cac} + X_{em} \cdot P_{em}. \qquad (12)$$

A second and third new state may be defined, respectively, as $P_b$, representing (as depicted in FIG. 4) the pressure drop across air throttle 26, and $P_c$, representing (as also depicted in FIG. 4) the pressure drop across EGR valve 22:

$$P_b = P_{cac} - P_{im}, \qquad (13)$$

and $$P_c = P_{em} - P_{im}. \qquad (14)$$

Transformation between the three new state variables ($P_a$, $P_b$, and $P_c$) from the original pressure states ($P_{im}$, $P_{cac}$, and $P_{em}$) may be represented, therefore, as:

$$\begin{bmatrix} P_a \\ P_b \\ P_c \end{bmatrix} = \begin{bmatrix} X_{im} & X_{cac} & X_{em} \\ -1 & 1 & 0 \\ -1 & 0 & 1 \end{bmatrix} \begin{bmatrix} P_{im} \\ P_{cac} \\ P_{em} \end{bmatrix}. \tag{15}$$

Likewise, transformation back to the original pressure states may be effected by solving for the original pressure states in equations 12 through 14:

$$P_{im} = \frac{P_a - X_{cac} \cdot P_{cac} - X_{em} \cdot P_{em}}{X_{im}}, \tag{16}$$

$$P_{cac} = P_{im} + P_b, \tag{17}$$

and $$P_{em} = P_{im} + P_c. \tag{18}$$

Substituting equations 17 and 18 into equation 16 yields:

$$X_{im} \cdot P_{im} = P_a - X_{cac} \cdot (P_{im} + P_b) - X_{em} \cdot (P_{im} + P_c), \tag{19}$$

which may be restated (through refactoring) as:

$$(X_{im} + X_{cac} + X_{em}) \cdot P_{im} = P_a - X_{cac} \cdot P_b - X_{em} \cdot P_c. \tag{20}$$

By definition, the sum of the capacitance fractions (X) is equal to 1, so the first part of equation 20 may be dropped, resulting in an expression of the three original pressure states solely in terms of capacitance fractions and the pressure states defined above:

$$P_{im} = P_a - X_{cac} \cdot P_b - X_{em} \cdot P_c, \tag{21}$$

$$P_{cac} = P_a + (1 - X_{cac}) \cdot P_b - X_{em} \cdot P_c, \tag{22}$$

and $$P_{em} = P_a - X_{cac} \cdot P_b + (1 - X_{em}) \cdot P_c. \tag{23}$$

This may be expressed in matrix form as:

$$\begin{bmatrix} P_{im} \\ P_{cac} \\ P_{em} \end{bmatrix} = \begin{bmatrix} 1 & -X_{cac} & -X_{em} \\ 1 & 1 - X_{cac} & -X_{em} \\ 1 & -X_{cac} & 1 - X_{em} \end{bmatrix} \begin{bmatrix} P_a \\ P_b \\ P_c \end{bmatrix}. \tag{24}$$

New state equations in the form of the new state variables ($P_a$, $P_b$, and $P_c$) may next be determined by taking the time derivative of equations 12 through 14 and substituting the original state equations 4-6. If series capacitances for the loops in circuit model 12b containing, respectively, air throttle 26 and EGR valve 22 are defined as:

$$C_{at} = \frac{C_{cac} \cdot C_{im}}{C_{cac} + C_{im}}, \tag{25}$$

and $$C_{egr} = \frac{C_{im} \cdot C_{em}}{C_{im} + C_{em}}, \tag{26}$$

new state equations may be expressed as:

$$\dot{P}_a = \frac{\dot{m}_{cmp} + \dot{m}_{eo} - \dot{m}_{ei} - \dot{m}_{trb}}{C_{im} + C_{cac} + C_{em}}, \tag{27}$$

$$\dot{P}_b = \frac{\dot{m}_{cmp}}{C_{cac}} + \frac{\dot{m}_{ei} - \dot{m}_{egr}}{C_{im}} - \frac{\dot{m}_{at}}{C_{at}}, \tag{28}$$

and $$\dot{P}_c = \frac{\dot{m}_{eo} - \dot{m}_{ei} - \dot{m}_{trb}}{C_{em}} - \frac{\dot{m}_{at}}{C_{im}} + \frac{\dot{m}_{ei} - \dot{m}_{egr}}{C_{egr}}. \tag{29}$$

An alternate set of state equations may further be defined using equivalent representative mass rates ($\dot{m}_a$, $\dot{m}_b$, and $\dot{m}_c$), under the identity of equation 3:

$$\dot{m}_a = (c_{im} + c_{cac} + c_{em}) \cdot \dot{P}_a, \tag{30}$$

$$\dot{m}_b = C_{at} \cdot \dot{P}_b, \tag{31}$$

and $$\dot{m}_c = C_{egr} \cdot \dot{P}_c. \tag{32}$$

By substituting equations 27 through 29 into equations 30 through 32, therefore, appropriate mass-based state equations may be determined for a representative rate of change of system mass ($\dot{m}_a$) and two representative mass flows ($\dot{m}_b$, and $\dot{m}_c$):

$$\dot{m}_a = \dot{m}_{cmp} + \dot{m}_{eo} - \dot{m}_{ei} - \dot{m}_{trb}, \tag{33}$$

$$\dot{m}_b = \frac{C_{at} \cdot \dot{m}_{cmp}}{C_{cac}} + \frac{C_{at} \cdot (\dot{m}_{ei} - \dot{m}_{egr})}{C_{im}} - \dot{m}_{at}, \tag{34}$$

and $$\dot{m}_c = \frac{C_{egr} \cdot (\dot{m}_{eo} - \dot{m}_{ei} - \dot{m}_{trb})}{C_{em}} - \frac{C_{egr} \cdot \dot{m}_{at}}{C_{im}} + \dot{m}_{ei} - \dot{m}_{egr}. \tag{35}$$

One advantage to using mass-based state equations (as in equations 33 through 35), for example, is that it will ensure that mass is appropriately conserved in relevant calculations.

Having determined mass-based state equations 33 through 35, it may further be appropriate to construct a related operating point model for both air throttle 26 and EGR valve 22. This may be necessary for appropriate modeling of the change in flow resistance as the pressure ratio changes and may, for example, assist in understanding and/or managing the dynamics that may cause numeric instability in other models (as discussed above).

Figure 5:
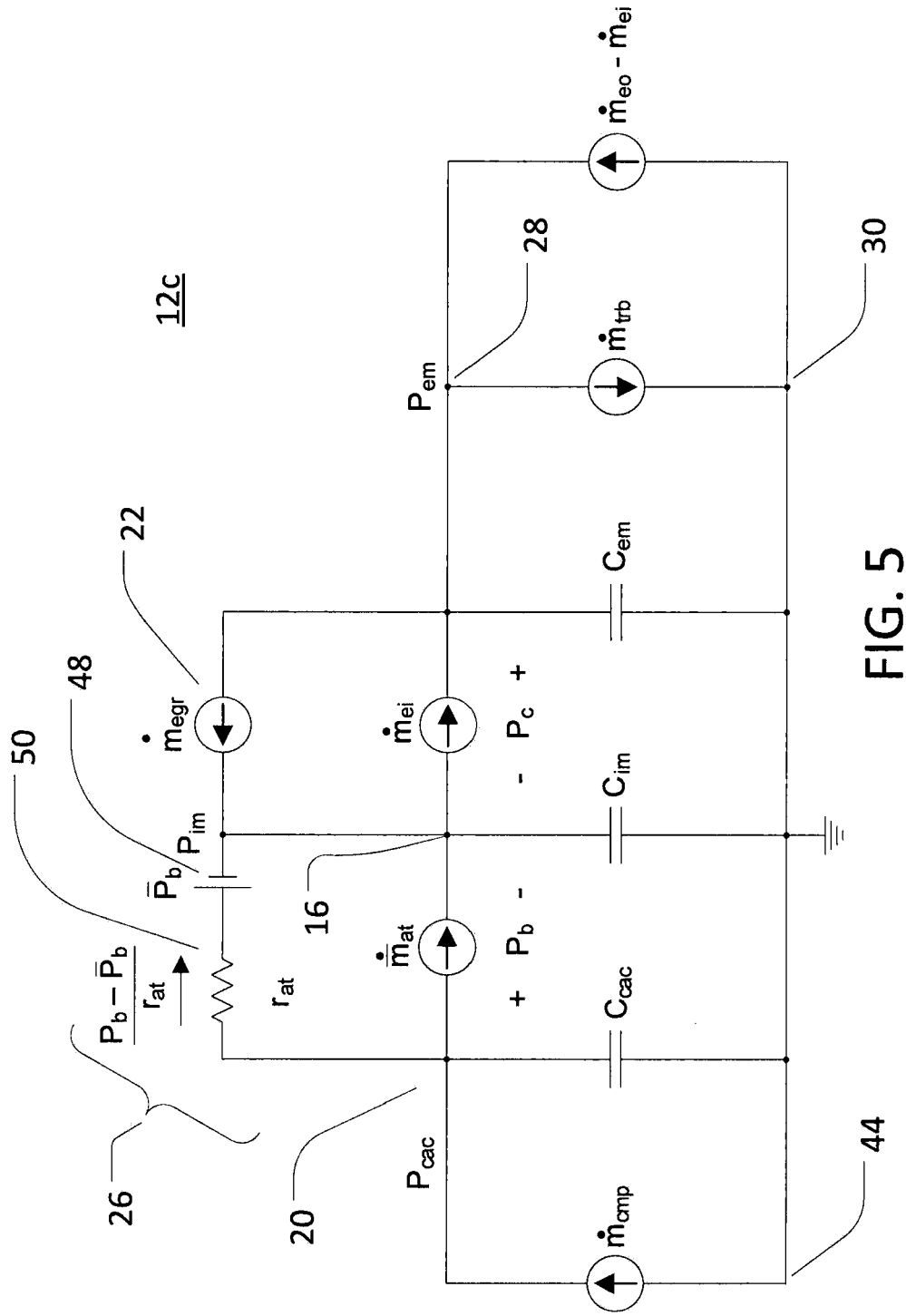
FIG. 5 is a schematic view of another modeling approach associated with the engine of FIG. 2 or FIG. 3.

Referring now also to FIG. 5, an operating model for air throttle 26 may be constructed by replacing the air throttle mass flow ($\dot{m}_{at}$) above with the air throttle mass flow at current operating conditions ($\overline{\dot{m}}_{at}$) and introducing to circuit model 12c of engine 12 a pressure "battery" 48, which represents operating point pressure drop ($\overline{P}_b$) across air throttle 26, and a "resistor" 50, exhibiting an operating point flow resistance ($r_{at}$).

The operating point flow rate ($\overline{\dot{m}}_{at}$) and operating point pressure ($\overline{P}_b$) may be calculated, for example, using the pressures, $P_{cac}$ and $P_{im}$, from a previous time step (as per, for example, equations 17 and 31). The operating point resistance ($r_{at}$) may be determined by calculating aspects of the flow through air throttle 26 two times. First the mass flow ($\dot{m}_{at}$) and pressure drop ($P_b$) may be calculated using $P_{cac}$ and $P_{im}$ from a previous (e.g., immediately prior) time step. Second, a small decrease (e.g., on the order of 1 kPa) to downstream pressure may be effected and the resultant mass flow ($\overline{\dot{m}}_{at}$) and pressure drop ($\overline{P}_b$) re-calculated. The throttle operating point resistance ($r_{at}$) may then be defined as the ratio of the pressure drops to the change in mass flows:

$$r_{at} = \frac{P_b - \overline{P}_b}{\dot{m}_{at} - \overline{\dot{m}}_{at}}. \tag{36}$$

Solving equation 36 for $\dot{m}_{at}$ and substituting into equation 28 yields a state equation for pressure drop rate ($\dot{P}_b$) across air throttle 26:

$$\dot{P}_b = \frac{\dot{m}_{cmp}}{C_{cac}} + \frac{\dot{m}_{ei} - \dot{m}_{egr}}{C_{im}} - \frac{\dot{m}_{at}}{C_{at}} - \frac{P_b - \overline{P}_b}{r_{at} \cdot C_{at}}. \tag{37}$$

In this context, notably, the mass flow rate, $\dot{m}_b$, as expressed in equation 38 (below), is not representative of the total mass flow through air throttle 26, but rather the portion of that mass flow causing the pressure change across the air throttle:

$$\dot{m}_b = C_{at} \cdot \dot{P}_b. \tag{38}$$

Substituting equation 37 into equation 38, then, gives a state equation in terms of mass, which, as also noted above, may be desirable to ensure conservation of mass in relevant calculations:

$$\dot{m}_b = \frac{C_{at} \cdot \dot{m}_{cmp}}{C_{cac}} + \frac{C_{at}(\dot{m}_{ei} - \dot{m}_{egr})}{C_{im}} - \dot{m}_{at} - \frac{P_b - \overline{P}_b}{r_{at}}. \tag{39}$$

Through rearranging and integrating equation 38, the pressure drop ($P_b$) across air throttle 26 may be expressed in terms of the portion of mass transfer between upstream and downstream volumes that is responsible for the pressure drop:

$$P_b = \frac{m_b}{C_{at}}. \tag{40}$$

Substituting equation 40 into equation 39 accordingly yields the state equation:

$$\dot{m}_b = \frac{C_{at} \cdot \dot{m}_{cmp}}{C_{cac}} + \frac{C_{at}(\dot{m}_{ei} - \dot{m}_{egr})}{C_{im}} - \dot{m}_{at} + \frac{\overline{P}_b}{r_{at}} - \frac{m_b}{r_{at} \cdot C_{at}}. \tag{41}$$

In order to better represent its constituent components, Equation 41 can be re-written as:

$$\dot{m}_b = \frac{\left(r_{at} \cdot C_{at} \cdot \left(\frac{C_{at} \cdot \dot{m}_{cmp}}{C_{cac}} + \frac{C_{at} \cdot (\dot{m}_{ei} - \dot{m}_{egr})}{C_{im}} - \dot{m}_{at} + \frac{\overline{P}_b}{r_{at}}\right) - m_b\right)}{r_{at} \cdot C_{at}}. \tag{42}$$

Assuming, then, that flow rates in equation 42 are constant, the first part of that equation may be viewed as representing the steady state value for mass change ($m_{bss}$) between intake manifold 16 and CAC 20:

$$\dot{m}_{bss} = r_{at} \cdot C_{at} \cdot \left(\frac{C_{at} \cdot \dot{m}_{cmp}}{C_{cac}} + \frac{C_{at} \cdot (\dot{m}_{ei} - \dot{m}_{egr})}{C_{im}} - \dot{m}_{at} + \frac{\overline{P}_b}{r_{at}}\right). \tag{43}$$

Equation 42 may then be simplified to equation 44, which may be recognized as the equation for a first order filter with time constant $r_{at} \cdot C_{at}$:

$$\dot{m}_b = \frac{m_{bss} - m_b}{r_{at} \cdot C_{at}}. \tag{44}$$

In light of the instability that may result under certain operating conditions (e.g., as described above with respect to open positions of throttle 26), it may be appropriate to modify the RC time constant of equation 44 (i.e., the throttle time constant, $r_{at} \cdot C_{at}$) with a throttle time constant modifier that replaces the original time constant, in appropriate circumstances, with one that will support numerically stable computation. This may be expressed as:

$$\dot{m}_b = \left(\frac{m_{bss} - m_b}{r_{at} \cdot C_{at}}\right) \cdot \left(\frac{r_{at} \cdot C_{at}}{\max(r_{at} \cdot C_{at}, \tau_{min})}\right), \tag{45}$$

wherein the throttle time constant modifier may be defined as:

$$AirThrottleDeltaMassRateModifer = \frac{r_{at} \cdot C_{at}}{\max(r_{at} \cdot C_{at}, \tau_{at})}. \tag{46}$$

The minimum throttle time constant, $\tau_{at}$, may be defined based on various criteria. In certain embodiments, for example, $\tau_{at}$ may be defined to be generally less than the throttle time constant ($r_{at} \cdot C_{at}$), when the air throttle is away from a fully open position. As such, when air throttle 26 is away from the open position, the throttle time constant modifier will generally be equal to 1, because the time constant $r_{at} \cdot C_{at}$ will generally be greater than $\tau_{at}$. When flow resistance decreases significantly, however, as may occur when air throttle 26 approaches a fully open configuration, the modifier will be smaller than one and may accordingly act to reduce the rate at which the modeled pressure drop (and corresponding mass flow) may change. In certain embodiments, in order to maintain numerical stability of the air system model, it may be appropriate to set the minimum time constant, $\tau_{at}$, to a value that is multiple integers greater than, for example, at least five times greater than, the time step for calculations (e.g., five times greater than a relevant sampling rate) with respect to the relevant computing device (e.g., ECU 46).

Recognizing that equation 39 is essentially equivalent to mass-based state equation 34, the throttle time constant modifier may also be appropriately applied with respect to equation 34:

$$\dot{m}_b = \left( \frac{C_{at} \cdot \dot{m}_{cmp}}{C_{cac}} + \frac{C_{at} \cdot (\dot{m}_{ei} - \dot{m}_{egr})}{C_{im}} - \dot{m}_{at} \right) \cdot \left( \frac{r_{at} \cdot C_{at}}{\max(r_{at} \cdot C_{at}, \tau_{min})} \right). \quad (47)$$

As similarly discussed above, this modification will modify the results of equation 47 only when $r_{at} \cdot C_{at}$ decreases below $\tau_{at}$ (e.g., when air throttle 16 approaches fully open). Further, the modification only affects the change in pressure across the air throttle 26 ($P_b$, via $\dot{m}_b$), therefore $P_{cac}$ and $P_{im}$ may still respond quickly to changes in other mass flow rates and, advantageously, may do so in relative unison.

Figure 6:
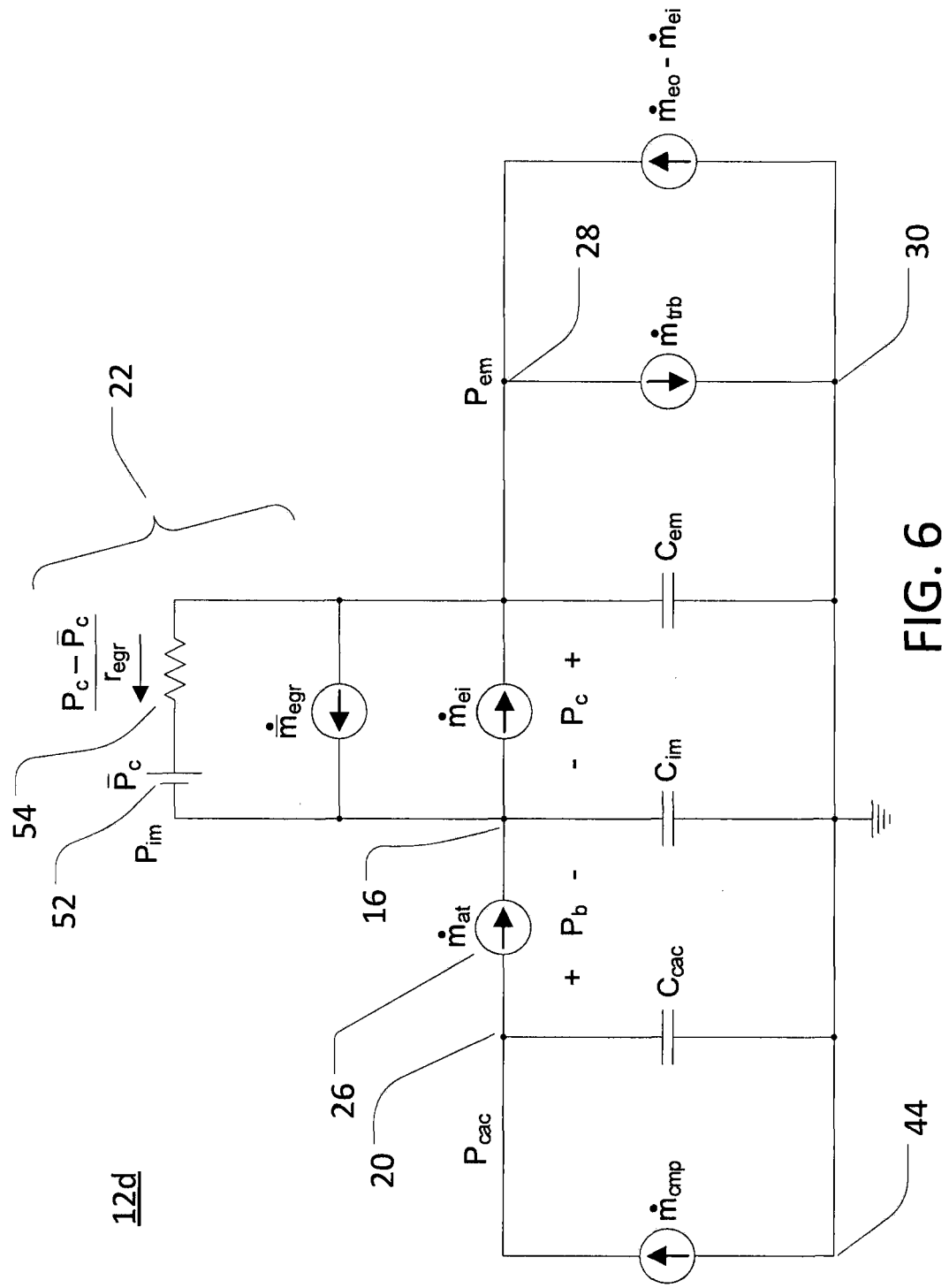
FIG. 6 is a schematic view of another modeling approach associated with the engine of FIG. 2 or FIG. 3.

Referring now also to FIG. 6, a similar transformation of state equations via construction of an operating point model may be conducted with respect to EGR valve 22, in keeping with the inclusion of pressure "battery" 52 and flow "resistor" 54 in circuit model 12d of engine 12. First, an EGR operating point resistance ($r_{egr}$) may be defined:

$$r_{egr} = \frac{P_c - \overline{P}_c}{\dot{m}_{egr} - \dot{\overline{m}}_{egr}}. \quad (48)$$

A state equation for pressure drop rate ($\dot{P}_c$) across EGR valve 22 may then be derived as:

$$\dot{P}_c = \frac{\dot{m}_{eo} - \dot{m}_{ei} - \dot{m}_{trb}}{C_{em}} - \frac{\dot{m}_{at}}{C_{im}} + \frac{\dot{m}_{ei} - \dot{\overline{m}}_{egr}}{C_{egr}} - \frac{P_c - \overline{P}_c}{r_{egr} \cdot C_{egr}}, \quad (49)$$

With the corresponding mass flow rate ($\dot{m}_c$) expressed as:

$$\dot{m}_c = C_{egr} \cdot \dot{P}_c. \quad (50)$$

Substituting equation 49 into equation 50 yields:

$$\dot{m}_c = \frac{C_{egr} \cdot (\dot{m}_{eo} - \dot{m}_{ei} - \dot{m}_{trb})}{C_{em}} + \frac{C_{egr} \cdot \dot{m}_{at}}{C_{im}} + \dot{m}_{ei} - \dot{\overline{m}}_{egr} - \frac{P_c - \overline{P}_c}{r_{egr}}. \quad (51)$$

Next, recognizing that:

$$P_c = \frac{m_c}{C_{egr}}, \quad (52)$$

equation 51 may be re-expressed as:

$$\dot{m}_c = \frac{C_{egr} \cdot (\dot{m}_{eo} - \dot{m}_{ei} - \dot{m}_{trb})}{C_{em}} + \frac{C_{egr} \cdot \dot{m}_{at}}{C_{im}} + \dot{m}_{ei} - \dot{\overline{m}}_{egr} + \frac{\overline{P}_c}{r_{egr}} - \frac{m_c}{r_{egr} \cdot C_{egr}}. \quad (53)$$

Factoring equation 53 yields, equations 54:

$$\dot{m}_c = \frac{\left( r_{egr} \cdot C_{egr} \cdot \left( \frac{C_{egr} \cdot (\dot{m}_{eo} - \dot{m}_{ei} - \dot{m}_{trb})}{C_{em}} + \frac{C_{egr} \cdot \dot{m}_{at}}{C_{im}} + \dot{m}_{ei} - \dot{\overline{m}}_{egr} + \frac{\overline{P}_c}{r_{egr}} \right) - m_c \right)}{r_{egr} \cdot C_{egr}}, \quad (54)$$

and, similarly to the discussion above, the first part of the equation 54 may be viewed as representing the steady state value ($m_{css}$) for mass change between intake manifold 16 and exhaust manifold 28:

$$m_{css} = r_{egr} \cdot C_{egr} \cdot \quad (55)$$
$$\left( \frac{C_{egr} \cdot (\dot{m}_{eo} - \dot{m}_{ei} - \dot{m}_{trb})}{C_{em}} + \frac{C_{egr} \cdot \dot{m}_{at}}{C_{im}} + \dot{m}_{ei} - \dot{\overline{m}}_{egr} + \frac{\overline{P}_c}{r_{egr}} \right).$$

Equation 54 may accordingly be simplified to equation 56, which may be recognized as the equation for a first order filter with time constant $r_{egr} \cdot C_{egr}$:

$$\dot{m}_c = \frac{m_{css} - m_c}{r_{egr} \cdot C_{egr}}. \quad (56)$$

Similar to the discussion above, in light of the instability that may result in certain operating conditions (e.g., with respect to open positions of EGR valve 22), it may be appropriate to modify the above RC time constant (i.e., the EGR valve 22 time constant, $r_{egr} \cdot C_{egr}$) of equation 56 with a throttle time constant modifier that replaces the original time constant, in appropriate circumstances, with one that supports model stability:

$$\dot{m}_c = \left( \frac{m_{css} - m_c}{r_{egr} \cdot C_{egr}} \right) \cdot \left( \frac{r_{egr} \cdot C_{egr}}{\max(r_{egr} \cdot C_{egr}, \tau_{min})} \right), \quad (57)$$

wherein an EGR valve time constant modifier may be defined as:

$$EGRValveDeltaMassRateModifier = \frac{r_{egr} \cdot C_{egr}}{\max(r_{egr} \cdot C_{egr}, \tau_{egr})}. \quad (58)$$

As discussed above regarding $\tau_{at}$, the minimum EGR valve time constant, $\tau_{egr}$, may be defined based on various criteria. In certain embodiments, for example, $\tau_{egr}$ may be defined to be generally less than the EGR valve time constant ($r_{egr} \cdot C_{egr}$), when the EGR valve is away from a fully open position. As such, when EGR valve 22 is away from the open position, the EGR valve time constant modifier will be equal to 1, because the time constant $r_{egr} \cdot C_{egr}$ will be greater than $\tau_{egr}$. When flow resistance decreases significantly, however, as may occur when EGR valve 22 approaches a fully open configuration, the modifier will be smaller than one and may accordingly act to reduce the rate at which the modeled pressure drop (and corresponding mass flow) may change. Similar to the discussion above with respect to the air throttle time constant, in certain embodiments, in order to maintain numerical stability of the described air system model, it may be appropriate to set the minimum time constant, $\tau_{egr}$, to a value at least multiple integers greater than, for example five times, the time step for calculations in the relevant computing device (e.g., ECU 46). As such, in certain embodiments, $\tau_{egr}$ and $\tau_{at}$ may be represented by the same minimum time constant.

Recognizing that equation 51 is essentially equivalent to mass-based state equation 35, the EGR valve time constant modifier may be also appropriately applied to equation 35:

$$\dot{m}_c = \left(\frac{C_{egr} \cdot (\dot{m}_{eo} - \dot{m}_{ei} - \dot{m}_{trb})}{C_{em}} - \frac{C_{egr} \cdot \dot{m}_{at}}{C_{im}} + \dot{m}_{ei} - \dot{m}_{egr}\right) \cdot \left(\frac{r_{egr} \cdot C_{egr}}{\max(r_{egr} \cdot C_{egr}, \tau_{min})}\right). \tag{59}$$

As similarly discussed above, this modification will modify the results of equation 59 only when $r_{egr} \cdot C_{egr}$ decreases below $\tau_{egr}$ (e.g., when EGR valve 22 approaches fully open). Further, similar to discussion above, the modification only affects the change in pressure across EGR valve 22 ($P_c$, via $\dot{m}_c$), therefore $P_{em}$ and $P_{im}$ may still respond quickly to changes in other mass flow rates and, advantageously, may do so in relative unison.

Accordingly, useful mass-based state equations may be expressed in equations 60 through 62, with equations 63 through 65 showing the relationship of the mass-based equations (60 through 62) to corresponding pressures:

$$\dot{m}_a = \dot{m}_{cmp} + \dot{m}_{eo} - \dot{m}_{ei} - \dot{m}_{trb}, \tag{60}$$

$$\dot{m}_b = \left(\frac{C_{at} \cdot \dot{m}_{cmp}}{C_{cac}} + \frac{C_{at} \cdot (\dot{m}_{ei} - \dot{m}_{egr})}{C_{im}} - \dot{m}_{at}\right) \cdot \left(\frac{r_{at} \cdot C_{at}}{\max(r_{at} \cdot C_{at}, \tau_{min})}\right), \tag{61}$$

$$\dot{m}_c = \left(\frac{C_{egr} \cdot (\dot{m}_{eo} - \dot{m}_{ei} - \dot{m}_{trb})}{C_{em}} - \frac{C_{egr} \cdot \dot{m}_{at}}{C_{im}} + \dot{m}_{ei} - \dot{m}_{egr}\right) \cdot \left(\frac{r_{egr} \cdot C_{egr}}{\max(r_{egr} \cdot C_{egr}, \tau_{min})}\right). \tag{62}$$

$$P_a = \frac{m_a}{C_{im} + C_{cac} + C_{em}}, \tag{63}$$

$$P_b = \frac{m_b}{C_{at}}, \tag{64}$$

and $$P_c = \frac{m_c}{C_{egr}}. \tag{65}$$

Equations 66 through 68 and 69 through 71 may then be utilized (i.e., solved based in part on the results of equations 63 through 65) to determine approximations of the modeled pressures and masses, respectively, of various volumes of engine 12:

$$P_{im} = P_a - X_{cac} \cdot P_b - X_{em} \cdot P_c, \tag{66}$$

$$P_{cac} = P_{im} + P_b, \tag{67}$$

$$P_{em} = P_{im} + P_c, \tag{68}$$

$$m_{im} = P_{im} \cdot C_{im}, \tag{69}$$

$$m_{cac} = P_{cac} \cdot C_{cac}, \tag{70}$$

and $$m_{em} = P_{em} \cdot C_{em}. \tag{71}$$

The equations above may be usefully employed, for example, utilizing ECU 46 of engine 12 (or another computing device), in order to model the operation of engine 12 during operation. When appropriately implemented, this may facilitate modeling of the engine in real time and with time steps that advantageously avoid the numerical instability exhibited by other techniques while avoiding excessive use of processor capacity and preserving suitable modeling accuracy. To further these aims (among others), in certain embodiments it may be appropriate to designate the minimum time constant of the time constant modifiers (i.e., $\tau_{at}$ and/or $\tau_{egr}$) based on an operating characteristic of ECU 46 (or another computing device). For example, it may be desirable to set one or both of the minimum time constants to at least 5 times greater than the time step (e.g., sampling rate) for model calculations in ECU 46 (e.g., as determined based upon a processor speed associated with ECU 46 and/or various other factors). For example, the air system model may be executed in ECU 46 by calculating all relevant flow rates every 20 ms, wherein a particular mass may be determined by adding to the mass of a previous time step the relevant flows in over 20 ms, and subtracting relevant flows out over 20 ms:

$$\text{Mass}(t) = [\text{Mass}(t-0.020) + (\text{Mass Flow In}(t) - \text{Mass Flow Out}(t)) \cdot 0.020] \tag{72}$$

As such, for example, it may be appropriate to set $\tau_{at}$ and/or $\tau_{egr}$ equal to 100 ms, or five times the default model sampling rate. In certain embodiments, other criteria may additionally or alternatively be appropriate, as may be determined, for example based upon routine experimental execution of the described air system model with respect to a particular engine in particular operating conditions.

Relevant input values (including relevant approximations of actual values) for the described air system model (e.g., relevant input values for equations 60 through 62) may be received by ECU 46 (and/or another relevant computing device or computing process) from a variety of sources. For example, in certain embodiments, the air system model may be executed with respect to an engine that is wholly (or partially) instrumented with various sensors (e.g., temperature, pressure, flow rate, and/or various other sensors). Accordingly, certain input values for the air system model may be received based upon measurements from certain of the various sensors. This configuration may be useful, for example, in order to calibrate the air system model, verify its accuracy for a particular system, fine tune the appropriate time constant modifiers, and so on.

In certain embodiments, the air system model may additionally or alternatively receive input values from various non-instrument sources. For example, certain input values may be estimated by a variety of known means and/or otherwise specified by user input. As another example, certain input values may be received by ECU 46 (or another relevant computing device or computing process) from one or more other models that may themselves execute various functionality in order to determine approximations of various relevant states of engine 12. For example, input to the described air system model may be received from a cylinder observer model, a turbocharger observer model, and/or various other models. Various speed-density methods may be utilized to calculate relevant input based upon, among other factors, intake manifold mixture density, engine speed, engine displacement, and volumetric efficiency corrections. Physics based models and/or regression models may be utilized to predict residual mass (e.g., $m_r$ in FIG. 3), and cylinder volumetric efficiency. Likewise, characteristics of compressor and turbine flows may be determined via compressor and turbine maps, and flows through throttle 26 and EGR valve 22 may be determined using the compressible gas flow equation. It will be understood that other models and methods may also be utilized in order to determine appropriate input values for the described air system model, and that various models and methods may be used in cooperation to provide input to the described model (e.g., a first method may provide an particular input to an intermediary model, which may then derive an appropriate input to be passed to the described air system model).

It will be understood that various engine instrumentation (e.g., pressure and temperature sensors, and so on) may additionally or alternatively be advantageously utilized to make corrections to the described air system model and/or another model that may, for example, provide one or more input parameters to the described air system model. For example, if a reliable sensor indicates that the described model (or another model that provides an input to the described model) has not predicted a particular temperature or pressure with appropriate accuracy, the relevant model may be adjusted based upon the actual measurement from the sensor. Conversely, in certain embodiments, a difference between predicted and measured values (e.g., a difference between predicted and measured pressures for a particular engine volume) may indicate that a particular sensor is malfunctioning and should be fixed or replaced. For example, if the described model has been appropriately calibrated and verified for a particular engine system or particular operating conditions, significant deviation of a pressure measurement by an engine sensor from a corresponding (predicted) pressure from the model may indicate that there is a problem with the sensor that needs to be addressed.

In certain embodiments, the described air system model may be advantageously employed not only to determine useful approximations of relevant engine states, but also to inform adjustment of engine operating conditions. For example, ECU 46 may be configured to prompt the adjustment of aspects of various engine operating parameters, such as cylinder valve timing, cylinder valve openings, engine speed, fuel consumption, throttle and other valve openings, and so on, based upon the modeled current (or other) state of engine 12. In certain embodiments such adjustments may be executed automatically, as based, for example, on criteria programmed into a memory associated with ECU 46 (or embodied in appropriate hardware linked thereto). In certain embodiments, such adjustments may additionally or alternatively be executed based upon operator or other input. For example, direct or modified results from execution of the model may be presented in various formats to operators of vehicle 10 or other users in order to inform the selection of particular engine adjustments by such operators or other users.

Figure 7:
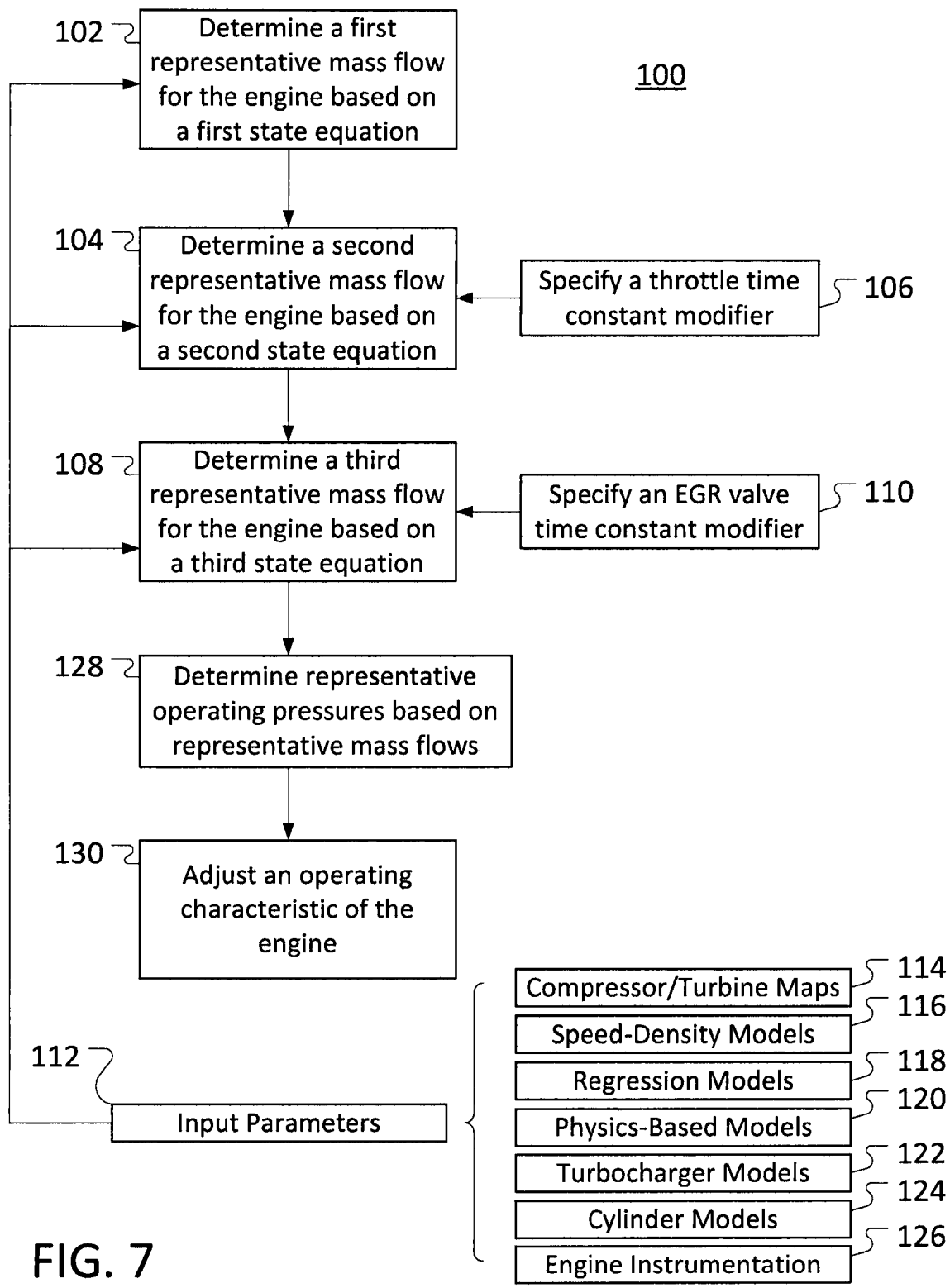
FIG. 7 is a process representation of aspects of execution of the disclosed method.

As such, referring now to FIG. 7, example process 100 may be executed with respect to engine 12 (e.g., by utilizing ECU 46). A first representative mass flow (e.g., $\dot{m}_a$) may be determined 102 based upon a first state equation (e.g., equation 60). A second representative mass flow (e.g., $\dot{m}_b$) may be determined 104 based upon a second state equation (e.g., equation 61), with respect to which a throttle time constant modifier $$\left(\text{e.g., } \frac{r_{at} \cdot C_{at}}{\max(r_{at} \cdot C_{at}, \tau_{at})}\right)$$

may be specified 106 (e.g., based on a relevant characteristic of ECU 46). A third representative mass flow (e.g., $\dot{m}_c$) may be determined 108 based upon a third state equation (e.g., equation 61), with respect to which an EGR valve time constant modifier $$\left(\text{e.g., } \frac{r_{egr} \cdot C_{egr}}{\max(r_{egr} \cdot C_{egr}, \tau_{egr})}\right)$$

may be specified 110 (e.g., based on a relevant characteristic of ECU 46). As also noted above, determining 102, 104, 108 the various representative mass flows may be based upon various input parameters 112, which may themselves be derived (and/or otherwise obtained) from a variety of sources, including compressor/turbine maps 114, speed-density models 116, regression models 118, physics-based models 120, turbocharger models 122, cylinder models 124, engine instrumentation 126, and so on.

Representative operating pressures may be determined 128 based upon, for example, the determined 102, 104, 108 representative mass flows. Further, in certain embodiments, one or more operating characteristics of the relevant engine may be adjusted 130, based upon, for example, determining 102, 104, 108 the various representative mass flows or determining 128 the representative operating pressures.

As such, referring now to FIG. 7, example process 100 may be executed with respect to engine 12 (e.g., by utilizing ECU 46). A first representative mass flow (e.g., $\dot{m}_a$) may be determined 102 based upon a first state equation (e.g., equation 60). A second representative mass flow (e.g., $\dot{m}_b$) may be determined 104 based upon a second state equation (e.g., equation 61), with respect to which a throttle time constant modifier $$\left(\text{e.g., } \frac{r_{at} \cdot C_{at}}{\max(r_{at} \cdot C_{at}, \tau_{at})}\right)$$

may be specified 106 (e.g., based on a relevant characteristic of ECU 46). A third representative mass flow (e.g., $\dot{m}_c$) may be determined 108 based upon a third state equation (e.g., equation 62), with respect to which an EGR valve time constant modifier $$\left(\text{e.g., } \frac{r_{egr} \cdot C_{egr}}{\max(r_{egr} \cdot C_{egr}, \tau_{egr})}\right)$$

may be specified 110 (e.g., based on a relevant characteristic of ECU 46). As also noted above, determining 102, 104, 108 the various representative mass flows may be based upon various input parameters 112, which may themselves be derived (and/or otherwise obtained) from a variety of sources, including compressor/turbine maps 114, speed-density models 116, regression models 118, physics-based models 120, turbocharger models 122, cylinder models 124, engine instrumentation 126, and so on.

Aspects of certain embodiments and possible implementations of the disclosure are described herein with reference to flowchart illustrations and/or block diagrams of methods, apparatus (systems) and computer program products according to embodiments of the invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood that each block of any flowchart illustrations and/or block diagrams, and/or each combination of blocks in the flowchart illustrations and/or block diagrams, can be implemented by computer program instructions, which may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. Similarly, such computer program instructions may be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks. Similarly, the computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The description of the present disclosure has been presented for purposes of illustration and description, but is not intended to be exhaustive or limiting to the disclosure. Many modifications and variations will be apparent to those of ordinary skill in the art without departing from the scope and spirit of the disclosure. Explicitly referenced embodiments herein were chosen and described in order to best explain the principles of the disclosure and their practical application, and to enable others of ordinary skill in the art to understand the disclosure and recognize many alternatives, modifications, and variations on the described examples. Accordingly, various embodiments and implementations other than those explicitly described are within the scope of the following claims.

What is claimed is:

1. A computer-implemented method of modeling an engine operation comprising:
   determining, by one or more computing devices, a representative rate of change of a system mass for an engine based upon, at least in part, a first state equation;
   determining, by the one or more computing devices, a first representative mass flow for the engine based upon, at least in part, a second state equation, the first representative mass flow approximating a mass flow across a throttle corresponding to a pressure drop across the throttle;
   determining, by the one or more computing devices, a second representative mass flow for the engine based upon, at least in part, a third state equation, the second representative mass flow approximating a mass flow across an exhaust gas recirculation valve corresponding to a pressure drop across the exhaust gas recirculation valve; and
   adjusting, by the one or more computing devices, one or more operating characteristics of the engine based upon, at least in part, one or more of the rate of change of the system mass, the first representative mass flow, the second representative mass flow;
   wherein determining the first representative mass flow includes specifying a throttle time constant modifier of less than one for the second state equation during at least one condition of the throttle; and
   wherein determining the second representative mass flow includes specifying an exhaust gas recirculation valve time constant modifier of less than one for the third state equation during at least one condition of the exhaust gas recirculation valve.

2. The computer-implemented method of claim 1, wherein one or more of the throttle time constant modifier and the exhaust gas recirculation valve time constant modifier is specified based upon, at least in part, an operating characteristic of the one or more computing devices.

3. The computer-implemented method of claim 1, further comprising:
   receiving, at the one or more computing devices, one or more of a value representing a mass flow into a cylinder included in the engine, a value representing a mass flow out of the cylinder, a value representing a mass flow through a turbine associated with the engine, a mass flow through a compressor associated with the engine, and a value representing a first mass flow temperature of the mass flow out of the cylinder;
   wherein one or more of the first, second and third state equations includes as a term one or more of the mass flow into the cylinder, the mass flow out of the cylinder, and the temperature of the mass flow out of the cylinder.

4. The computer-implemented method of claim 3, wherein one or more of the value representing the mass flow into the cylinder, the value representing the mass flow out of the cylinder, and the value representing the temperature of the mass flow out of the cylinder are determined based upon a cylinder model.

5. The computer-implemented method of claim 1, further comprising:
   receiving, at the one or more computing devices, one or more of a value representing a mass flow through a compressor associated with the engine, a value representing a mass flow through a turbine associated with the engine, and a value representing a temperature at an output of the compressor;
   wherein one or more of the first, second and third state equations includes as a term the one or more of the mass flow through the compressor, the mass flow through the turbine, and the temperature at the output of the compressor.

6. The computer-implemented method of claim 5, wherein one or more of the mass flow through the compressor, the mass flow through the turbine, and the temperature at the output of the compressor is determined based upon a turbocharger model.

7. The computer-implemented method of claim 1, wherein the first state equation includes a mass flow balance.

8. The computer-implemented method of claim 1, wherein the second state equation includes one or more of a throttle capacitance, a charge air cooler capacitance, and an intake manifold capacitance.

9. The computer-implemented method of claim 1, wherein the third state equation includes one or more of an exhaust gas recirculation capacitance, an exhaust manifold capacitance, and an intake manifold capacitance.

10. The computer-implemented method of claim 1, wherein the one or more computing devices includes an engine control unit in the engine, the engine being in an operating state.

11. The computer-implemented method of claim 1, further comprising:
   determining, by the one or more computing devices, one or more representative operating pressures for the engine based upon, at least in part, one or more of the rate of change of the system mass, the first representative mass flow, and the second representative mass flow.

12. The computer-implemented method of claim 11, wherein the adjusting the one or more operating characteristics of the engine is further based upon, at least in part, the one or more representative operating pressures.

13. A work vehicle, comprising:
   an engine included in the vehicle, the engine being in an operating state and including an air throttle located between a charge air cooler and an intake manifold, and an exhaust gas recirculation valve located between an exhaust gas recirculation cooler and an intake manifold; and
   an engine control unit associated with the engine, the engine control unit including one or more processor devices and one or more memory architectures coupled with the one or more processor devices,
   wherein the one or more processor devices are configured to:
      determine a representative rate of change of a system mass for the engine based upon, at least in part, a first state equation;
      determine a first representative mass flow for the engine based upon, at least in part, a second state equation, wherein the first representative mass flow approximates a mass flow across the air throttle corresponding to a pressure drop across the throttle;
      determine a second representative mass flow for the engine based upon, at least in part, a third state equation, wherein the second representative mass flow approximates a mass flow across the exhaust gas recirculation valve corresponding to a pressure drop across the exhaust gas recirculation valve; and
      adjust one or more operating characteristics of the engine based upon, at least in part, one or more of the rate of change of the system mass, the first representative mass flow, the second representative mass flow;
      wherein determining the first representative mass flow includes specifying an air throttle time constant modifier of less than one for the second state equation during at least one condition of the air throttle; and
      wherein determining the second representative mass flow includes specifying an exhaust gas recirculation valve time constant modifier of less than one for the third state equation during at least one condition of the exhaust gas recirculation valve.

14. The work vehicle of claim 13, wherein the one or more processor devices are further configured to:
   receive one or more of a value representing a mass flow into a cylinder included in the engine, a value representing a mass flow out of the cylinder, and a value representing a temperature of the mass flow out of the cylinder;
   wherein one or more of the first, second and third state equations includes as a term one or more of the mass flow into the cylinder, the mass flow out of the cylinder, and the temperature of the mass flow out of the cylinder.

15. The work vehicle of claim 13, wherein the one or more processor devices are further configured to:
   receive one or more of a value representing a mass flow through a compressor associated with the engine, a value representing mass flow through a turbine associated with the engine, and a value representing a temperature at an output of the compressor;
   wherein one or more of the first, second and third state equations includes as a term one or more of the mass flow through the compressor, the mass flow through the turbine, and the temperature at the output of the compressor.

16. The work vehicle of claim 13, wherein the first state equation includes a mass flow balance.

17. The work vehicle of claim 13, wherein the second state equation includes one or more of a throttle capacitance, a charge air cooler capacitance, and an intake manifold capacitance.

18. The work vehicle of claim 13, wherein the third state equation includes one or more of an exhaust gas recirculation capacitance, an exhaust manifold capacitance, and an intake manifold capacitance.

19. The work vehicle of claim 13, wherein the one or more processor devices are further configured to:
   determine one or more representative operating pressures for the engine based upon, at least in part, one or more of the representative rate of change of the system mass, the first representative mass flow, and the second representative masses.

20. The work vehicle of claim 19, wherein the one or more processor devices are further configured to:
   adjust the one or more operating characteristics of the engine based upon, at least in part, the one or more representative operating pressures.

* * * * *